(12) United States Patent
Ladiray

(10) Patent No.: US 6,927,427 B2
(45) Date of Patent: Aug. 9, 2005

(54) BIDIRECTIONAL STATIC SWITCH RESPONSIVE IN QUADRANTS Q4 AND Q1

(75) Inventor: Olivier Ladiray, Montlouis sur Loire (FR)

(73) Assignee: STMicroelectronics S.A., Montrouge (FR)

(*) Notice: Subject to any disclaimer, the term of this patent is extended or adjusted under 35 U.S.C. 154(b) by 78 days.

(21) Appl. No.: 10/324,248

(22) Filed: Dec. 19, 2002

(65) Prior Publication Data

US 2003/0122211 A1 Jul. 3, 2003

(30) Foreign Application Priority Data

Dec. 28, 2001 (FR) .............................................. 01 17040

(51) Int. Cl.[7] .............................................. H01L 29/74
(52) U.S. Cl. ........................................ 257/119; 257/107
(58) Field of Search ................................. 257/119, 123, 257/124, 107, 120, 126, 121, 157

(56) References Cited

U.S. PATENT DOCUMENTS

| 4,157,562 | A | * | 6/1979 | D'Altroy et al. | ............ | 257/128 |
| 6,017,778 | A |   | 1/2000 | Pezzani | | |
| 6,049,096 | A |   | 4/2000 | Bernier | | |
| 6,075,277 | A |   | 6/2000 | Pezzani | | |
| 6,252,257 | B1 |  | 6/2001 | Duclos et al. | | |
| 6,593,600 | B1 | * | 7/2003 | Duclos et al. | ............... | 257/107 |
| 2001/0002870 | A1 | | 6/2001 | Pezzani | | |

FOREIGN PATENT DOCUMENTS

| EP | 1 076 365 A1 | 2/2001 |
| EP | 1 098 355 A1 | 5/2001 |
| WO | WO 99/35692 A1 | 7/1999 |
| WO | WO 02/50916 A1 | 6/2002 |

* cited by examiner

Primary Examiner—Howard Weiss
Assistant Examiner—Hoa B. Trinh
(74) Attorney, Agent, or Firm—Lisa K. Jorgenson; James H. Morris; Wolf, Greenfield & Sacks, P.C.

(57) ABSTRACT

A monolithic bidirectional switch formed in an N-type semiconductor substrate, including, in a first area, a first vertical thyristor adjacent to a second vertical thyristor; a triggering area arranged on the front surface side, apart from the first area, including a P-type well in which is formed an N-type region; a first metallization covering the rear surface; a second metallization on the front surface layers of the first and second thyristors; a third gate metallization on said well; on the rear surface side, an additional P-type region and an insulating layer interposed between this additional region and the first metallization, the additional region extending under the triggering area; and a fourth metallization on the region.

5 Claims, 2 Drawing Sheets

BIDIRECTIONAL STATIC SWITCH RESPONSIVE IN QUADRANTS Q4 AND Q1

BACKGROUND OF THE INVENTION

1. Field of the Invention

The present invention relates to the manufacturing in monolithic form of medium-power bidirectional switches.

2. Discussion of the Related Art

The most current static bidirectional switches are triacs. A triac corresponds to the antiparallel association of two thyristors. It can thus be directly connected in an A.C. network, for example, the mains. The gate of a conventional triac corresponds to the cathode gate of one at least of the two thyristors forming it and is referenced to the electrode located on the front surface side of this triac, that is, the surface including the gate terminal while the rear surface of the triac, at the high voltage, is currently connected to a radiator, which poses isolation problems.

U.S. Pat. No. 6,552,370 describes a new type of bidirectional switch, the triggering of which is ensured by application of a voltage between a control electrode located on the front surface of the component and an electrode at the voltage of the main electrode located on the opposite surface or rear surface of the component, formed of a metallization covering this entire rear surface, which may be grounded.

U.S. Pat. No. 6,593,600 describes an improvement of the above switch enabling obtaining a relatively high responsiveness to the control in quadrants Q3 and Q2, that is, when the gate is likely to receive a negative control voltage with respect to the rear surface electrode.

SUMMARY OF THE INVENTION

The present invention aims at providing an improvement to the component of U.S. Pat. No. 6,593,600 that enables obtaining a relatively high responsiveness to a control in quadrants Q4 and Q1, that is, when the gate is likely to receive a positive control voltage with respect to the currently grounded rear surface electrode and the front surface electrode is respectively negative and positive with respect to the rear surface electrode.

To achieve this and other objects, the present invention provides a monolithic bidirectional switch formed in a semiconductor substrate of a first conductivity type having a front surface and a rear surface, including, in a first area, a first main vertical thyristor having a rear surface layer of the second conductivity type, adjacent to a second main vertical thyristor having a rear surface layer of the first conductivity type; a triggering area arranged on the front surface side, apart from the first area, this triggering area including a well of the second conductivity type in which is formed a region of the first conductivity type; a first main electrode metallization, covering the rear surface; a second main electrode metallization on the front surface layers of the first and second thyristors; a third gate metallization on said well; and, on the rear surface side, an additional region of the second conductivity type and an insulating layer interposed between this additional region and the first rear surface metallization, said additional region extending under the triggering area and partially under the first area; and a fourth metallization on said region.

According to an embodiment of the present invention, the bidirectional switch includes a peripheral wall of the second conductivity type extending from the rear surface to the front surface.

According to an embodiment of the present invention, in operation, the fourth metallization is connected to the voltage of the rear surface metallization.

According to an embodiment of the present invention, said well, in top view, encircles the first area, said region extending on one side only of the first area, on the side of the first thyristor.

According to an embodiment of the present invention, at the periphery of the first area is arranged a lightly-doped layer of the second conductivity type separated from the rest of the structure by a sufficiently broad area of the substrate to withstand the desired breakdown voltage of the component, this sufficiently broad area being divided in two parts by a stop-channel ring.

The foregoing objects, features and advantages of the present invention, will be discussed in detail in the following non-limiting description of specific embodiments in connection with the accompanying drawings.

DETAILED DESCRIPTION

For clarity, the same elements have been referred to with same references in the different drawings. Further, as usual in the representation of integrated circuits, FIGS. 1 and 2 are not drawn to scale.

Figure 1:
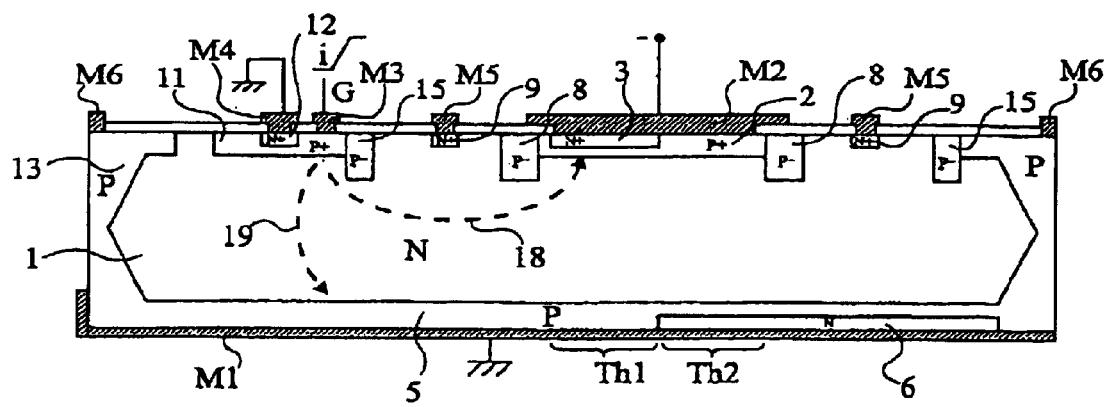
FIG. 1 is a simplified cross-section view of an embodiment of a bidirectional switch according to an aspect of the present invention.
Figure 2:
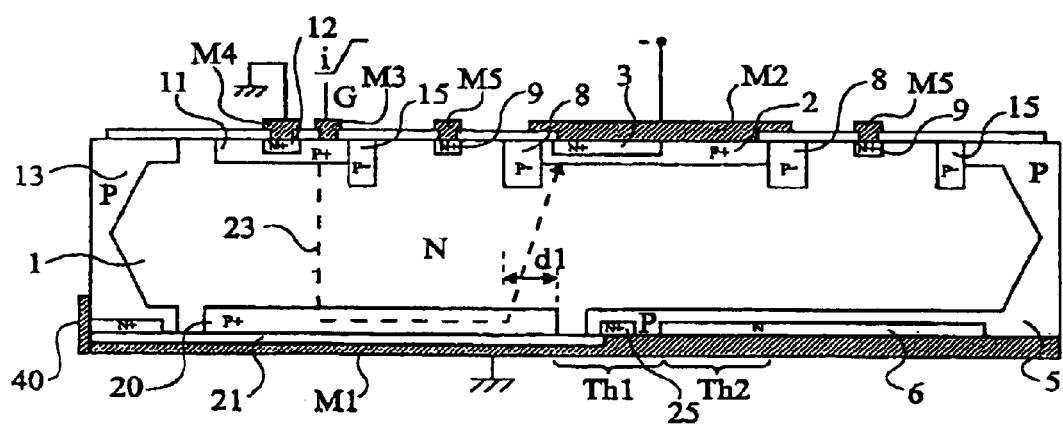
FIG. 2 is a simplified cross-section view of an embodiment of a bidirectional switch according to the present invention.

FIG. 1 is a simplified cross-section view of an embodiment of a monolithic bidirectional switch according to the present invention. The component includes a medium-power switching structure able to have a high breakdown voltage, for example, from 300 to 1,000 volts. Conversely to what is shown in FIG. 1 for clarity, this switching structure actually takes up most of the component surface area. The switching structure includes two thyristors Th1 and Th2 in antiparallel. The component is formed in an N-type semiconductor substrate 1. On the front surface side is formed a P-type well 2 in which is formed an N-type region 3. On the rear surface side is formed a P-type layer 5 in which is formed an N-type region 6, at least facing the portion of well 2 which is not occupied by layer 3. Thyristor Th1 corresponds to regions and layers 5-1-2-3 and has its anode on the rear surface side. Second thyristor Th2 is formed of regions and layers 6-5-1-2 and has its anode on the front surface side.

On the front surface side, switching structure Th1, Th2 is surrounded with a peripheral region intended to determine the breakdown voltage. This peripheral region for example includes lightly-doped P-type ring 8 at the periphery of well 2, laterally separated from the other structure elements by a region of the N substrate in the middle of which is formed an N-type stop-channel ring 9.

The triggering structure is formed of a P-type well 11 in which is formed an $N^+$-type region 12. The component periphery is delimited by a P-type wall 13 which extends from the rear surface to the front surface. A $P^-$-type ring 15 which, to the right of the drawing, forms the limit of wall 13 and, to the left of the drawing, forms the limit of P-type well 11, has also been shown to improve the breakdown voltage of the switch portion. Well 11 is separated from wall 13 by a distance sufficient to hold the voltage. As an alternative, not shown, to avoid parasitic triggerings and desensitize lateral thyristor 2-1-11-12, a resistor is provided between well 11 and wall 13. This resistor may for example be formed by a lightly-doped P-type region (P−) between well 11 and wall 13.

The entire rear surface of the component is coated with a metallization M1, as conventional in the field of medium power or power components. A metallization M2 covers the anode of thyristor Th2 and the cathode of thyristor Th1. A gate metallization M3, connected to a gate terminal G, is formed on P well 11 and a metallization M4 is formed on $N^+$ region 12. Preferably, a ring-shaped metallization M5 coats ring-shaped region 9 and a ring-shaped metallization M6 coats the periphery of wall 13. Metallizations M5 and M6 are not connected to outer terminals and are only intended to ensure the equipotentiality of the underlying doped regions.

The bidirectional switch according to the present invention is intended to be triggered by the setting to a positive voltage of gate terminal G while metallization M4 is grounded, like metallization M1. This triggering mode is one aspect of the present invention.

In quadrant Q4, that is, when metallization M2 is negative with respect to metallization M1, which is grounded, and a positive voltage is applied to the gate terminal, a gate current flows through the junction between P well 11 and $N^+$ gate region 12, which is forward biased. Electrons are then injected into the substrate by diffusion and they return to gate metallization G which is at the most positive voltage. From region 11 of gate G, holes are injected into the substrate. These holes are then attracted by the most negative potentials existing in the structure. The most negative potential is the potential on metallization M2. Thus, the holes (arrow 18) tend to unblock the junction between N-type substrate 1 and P-type well 2 and thyristor Th1 tends to turn on. However, given that metallization M1, which is grounded, is more negative than the gate region potential, part of the holes (arrow 19) will direct to this metallization, at the level of which they will recombine and these holes are lost for the triggering. As a result, a significant gate current must be provided to be able to trigger the thyristor.

The path to be followed by the holes to reach the triggering area of thyristor Th1 (arrow 18) is relatively long, given that a free area must be provided at the periphery of the actual switching structure, to ensure a sufficient breakdown voltage. Thus, in the case where an $N^+$ region (not shown) exists on the rear surface side in front of the triggering area, similarly to what has been described in above-mentioned European patent application 1,076,365, it has been acknowledged that a gate current greater than 40 milliamperes is necessary to trigger thyristor Th1 in quadrant Q4.

As shown in FIG. 2, to improve the triggering sensitivity, the present invention provides, in addition to the specific triggering structure illustrated in FIG. 1, arranging under the triggering area a heavily-doped P-type region 20 insulated from metallization M1 by an insulating layer 21, preferably an oxide layer. With such a structure, upon triggering, the above-mentioned holes follow path 23 shown in dotted lines and propagate practically with no recombination in heavily-doped P-type layer 20. For layer 20 to be efficient, not only must it be present under the triggering area, that is, under well 11, but also must it partly encroach under the area corresponding to the actual switching structure. The distance between the projection of the external portion of P-type ring 8 and the projection of the limit of P region 20 under the actual switching structure has been indicated in FIG. 2 by reference d1. Distance d1 especially includes the width of ring 8.

Figure 3:
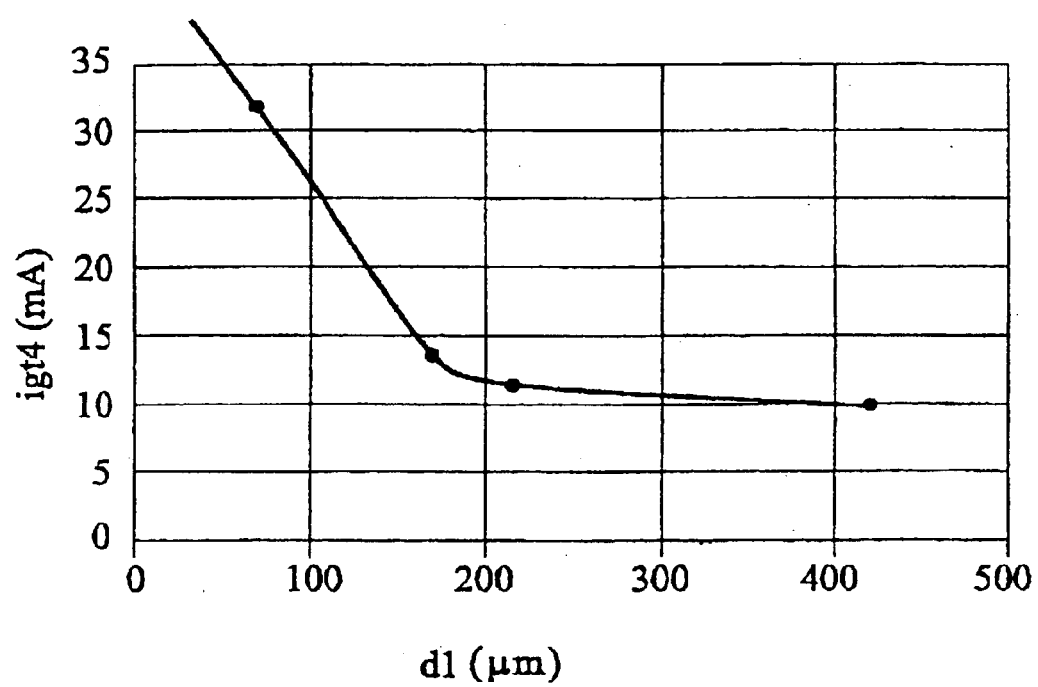
FIG. 3 illustrates a characteristic of the turn-on current of the bidirectional switch according to the present invention.

FIG. 3 shows the value of triggering current igt4 of thyristor Th1 when its cathode is negatively biased, according to the value of distance d1. It can be seen that, when distance d1 is very small, the gate current has a high value that can reach approximately 40 mA as indicated previously. As soon as distance d1 becomes greater than the width of ring 8, the triggering current decreases and substantially reaches a minimum when value d1 is approximately 200 µm to then remain substantially constant. The value of the triggering current then is on the order of 10 mA, which is quite acceptable.

A lateral metallized area 40 has also been shown in FIG. 2, at the external periphery of the insulating wall. This area corresponds to a possible wicking. It should be noted that, in the illustrated case, this wicking is of no incidence on the circuit operation. This is another advantage of the structure according to the present invention.

Of course, the component according to the present invention must also operate satisfactorily when controlled in quadrant Q1, that is, when, while the gate current is still positive, main metallization M2 is positively biased with respect to main metallization M1. In this case, the electrons diffused in the substrate from $N^+$ region 12 are considered. These electrons easily propagate through the N-type substrate towards positive metallization M2 to turn on the blocking junction between N-type layer 3 and well 2. The presence of insulated $P^+$ region 20 is of no incidence on the operation of this triggering mode and also provides the advantage, which is relatively secondary in this case, of avoiding recombination on the side of metallization M1.

It is within the abilities of those skilled in the art to bring various improvements to the structure according to the present invention to optimize its operation. For example, gate contact M3 will preferably be placed as close as possible to the power area. As an example, if, in FIG. 2, the gate contact was put under metallization M4 and not under metallization M3, it would be switched from a triggering current on the order of 10 mA to a triggering current on the order of 25 mA. Indeed, in this case, the amount of holes lost in the insulating wall is no longer negligible as compared to that directed to insulated rear layer 20.

On the other hand, to ease the triggering of thyristor Th1 in quadrant Q4, it is preferable for the resistance of P-type well 2 under $N^+$-type region 3 to be relatively high.

To ensure the breakdown voltage, a sufficient distance between P-type insulated layer 20 and, on the one hand, wall 13, and on the other hand, P layer 5, will be provided. An N-type doped layer 25 will preferably be provided at the limit of insulating layer 21 on the side of the power component in P-type doped layer 5. This avoids for part of the holes to be attracted via this P layer into metallization M1.

Well 11 may extend in a ring covered with gate metallization M3 surrounding the entire power area.

Of course, the present invention is likely to have various alterations, modifications, and improvements which will readily occur to those skilled in the art. In particular, the present invention applies to any type of monolithic forming of the structure of a switch network. Further, all conductivity types may be inverted, the biasings then being modified accordingly. Also, to improve the thyristor sensitivity, emitter short-circuit holes may usually be provided in N+ region 3 corresponding to the cathode of thyristor Th1.

Such alterations, modifications, and improvements are intended to be part of this disclosure, and are intended to be within the spirit and the scope of the present invention. Accordingly, the foregoing description is by way of example only and only as defined in the following claims and the equivalents is not intended to be limiting. The present invention is limited thereto.

What is claimed is:

1. A monolithic bidirectional switch formed in a semiconductor substrate of a first conductivity type having a front surface and a rear surface, including:

in a first area, a first main vertical thyristor having a rear surface layer of the second conductivity type, adjacent to a second main vertical thyristor having a rear surface layer of the first conductivity type;

a triggering area arranged on the front surface side, apart from the first area, this triggering are including a well of the second conductivity type in which is formed a region of the first conductivity type;

a first main electrode metallization, covering the rear surface;

a second main electrode metallization on the front surface layers of the first and second thyristors;

a third gate metallization on said well;

on the rear surface side, an additional region of the second conductivity type and an insulating layer interposed between this additional region and the first rear surface metallization, said additional region extending under the triggering area and partially under the first area and being separated from rear surface layers of the first and second thyristors; and a fourth metallization on said region.

2. The bidirectional switch of claim 1, including a peripheral wall of the second conductivity type extending from the rear surface to the front surface.

3. The bidirectional switch of claim 1, wherein, in operation, the fourth metallization is connected to the voltage of the rear surface metallization.

4. The bidirectional switch of claim 3, wherein said well, in top view, encircles the first area, said region extending on one side only of the first area, on the side of the first thyristor.

5. The bidirectional switch of claim 3, wherein at the periphery of the first area is arranged a lightly-doped layer of the second conductivity type separated from the rest of the structure by a sufficiently broad area of the substrate to withstand the desired breakdown voltage of the component, this sufficiently broad area being divided in two parts by a stop-channel ring.

* * * * *